United States Patent [19]

Montress et al.

[11] Patent Number: 5,126,694
[45] Date of Patent: Jun. 30, 1992

[54] PHASE LOCKED OSCILLATOR

[75] Inventors: Gary K. Montress, Westford, Mass.; Mark E. Russell, Londonderry, N.H.

[73] Assignee: Raytheon Company, Lexington, Mass.

[21] Appl. No.: 728,664

[22] Filed: Jul. 11, 1991

[51] Int. Cl.⁵ .................. H03L 7/06; H03L 7/085; H03L 7/099
[52] U.S. Cl. .................................. 331/18; 331/17; 331/25; 331/36 C; 331/107 A
[58] Field of Search ................ 331/17, 18, 25, 36 R, 331/36 C, 107 A

[56] References Cited

U.S. PATENT DOCUMENTS 4,325,032 4/1982 Gilden ..................... 331/107 A X

Primary Examiner—David Mis
Attorney, Agent, or Firm—Denis G. Maloney; Richard M. Sharkansky

[57] ABSTRACT

A SAW stabilized oscillator includes a phase locking circuit which is phase locked to a lower frequency reference signal having an odd order difference with respect to the fundamental frequency of the SAW oscillator. A mixer is disposed in the phase locking circuitry and is used as a sub-harmonic phase detector by mixing the fundamental with an odd harmonic of the reference signal.

14 Claims, 5 Drawing Sheets

PHASE LOCKED OSCILLATOR

BACKGROUND OF THE INVENTION

This invention relates generally to oscillators and more particularly to phase locked oscillators.

As is known in the art, there exists a need in many radio frequency applications such as in radar receivers and transmitters for highly stable oscillators or sources of radio frequency signals. One of the more general approaches is to use a so-called SAW stabilized oscillator in which a SAW device such as a delay line or a resonator is disposed within a feedback loop which has an integral number of $2\pi$ radians of phase shift and excess small signal gain at a particular frequency within the passband frequency of the SAW stabilizing device.

In many of these applications, it is necessary to have an oscillator which is highly stable both over long periods of time, as well as, over relatively short periods of time. The first stability characteristic is generally referred to as aging characteristics of the oscillator and is principally related to long-term variations in the electrical characteristics of the devices providing the SAW stabilized oscillator. One of the major contributors to variations in oscillator performance over long periods of time may be the SAW device itself. SAW devices typically have aging rates on the order of several parts per million per year, although SAW resonators are now available having aging rates on the order of one part per million per year or less.

The second problem concerning frequency instability is short-term frequency variations or noise. SAW stabilized oscillators have relatively poor close to carrier phase noise characteristics. That is, there exists a relatively large amount of noise power per unit bandwidth at offset frequencies close to the carrier or fundamental frequency of the oscillator. This results principally from inherent characteristics of the SAW stabilizing element and other oscillator components such as the loop amplifiers.

It is known to address some of the aforementioned problems by including in the SAW oscillator loop a voltage controllable phase shifter which can introduce a relatively small amount of phase shift into the loop and thus adjust the frequency of oscillation of the loop or to lock the frequency of oscillation to a desired frequency. Generally to lock the frequency of the oscillator, an error signal is provided which represents the difference in phase between the fundamental frequency of the SAW oscillator loop and a reference signal.

When the reference signal has a frequency equal to the frequency of the oscillator loop, the above phase locking arrangement is relatively straight forward. Moreover, when the ratio of the fundamental frequency to the reference frequency is of the form of $2^N$ where N is an integer $\geq 1$, then the generation of an error signal is also relatively straight forward. For example, such a signal can be generated by using a cascade of frequency doublers to multiply the reference signal up to the frequency of the SAW oscillator. The frequency multiplied reference signal and SAW oscillator signal are fed to a phase detector to provide the error signal.

A problem arises, however, when the ratio of the fundamental frequency signal and the reference frequency signals has an odd prime factor or a ratio of the form $2^N \cdot m$ where N is an integer $\geq 1$ and m is of the form $(2n+1)$ where n is an integer $\geq 1$. The problem is that known techniques for providing odd order frequency multiplication are not suitable for compact, low phase noise SAW stabilized oscillators. Two known techniques are to provide parametric frequency multiplication using non-linear devices such as step recovery diodes or varactor diodes. One problem with these techniques, however, is that they are relatively difficult to design with and, furthermore, the inherent characteristics of step recovery diodes and varactor diodes provide an odd order frequency multiplier circuit having unacceptable frequency stability. The poor frequency stability of the multiplier would provide a phase locking signal having likewise poor stability and thus degrade the overall performance of the phase locked oscillator.

SUMMARY OF THE INVENTION

In accordance with the present invention, an oscillator includes a voltage controllable oscillator having an output terminal and a control terminal and means coupled to said output terminal of said voltage controllable oscillator for providing a first pair of signal paths. The oscillator further includes means, including a mixer coupled to a first one of said first pair of signal paths and coupled to a reference signal terminal fed by a reference signal having a frequency differing by an odd-order integer from a nominal frequency of said voltage controllable oscillator, for providing an error signal to the control terminal of the voltage controllable oscillator representing the variation in phase between the frequency of the reference signal and the frequency of the signal from the voltage controllable oscillator. With such an arrangement, a voltage controllable oscillator is provided which can be locked to a reference signal having a frequency which differs from that the frequency of the SAW oscillator by an odd order factor. The mixer arrangement has better frequency stability characteristics and is more easy to design with than prior approaches. The mixer is used as a sub-harmonic phase detector between the fundamental frequency $\omega_0$ of the voltage controllable oscillator and the reference signal having an odd order relationship to the fundamental frequency $\omega_0$ to generate an error signal corresponding to the difference in phase variation between the phase of the signal $\omega_0$ and the phase of the reference signal.

In accordance with a further aspect of the present invention, a phase locked oscillator includes a SAW stabilized voltage controllable oscillator having an output terminal. The SAW oscillator includes means for providing a closed loop having an integral multiple of $2\pi$ radians of phase shift and excess small signal gain at a frequency $\omega_0$ with said means also including a SAW resonator or delay line disposed within said closed loop having a resonant frequency at $\omega_0$ and a voltage controllable phase shifter disposed in said loop and having a control terminal. The phase locked oscillator further includes a power divider having an input coupled to the output of the SAW stabilized oscillator and a first output coupled to the output of the phase locked oscillator. The oscillator further includes means, coupled to a reference signal input terminal, for multiplying the frequency of a reference signal by a factor of $2^N$ where N is an integer $\geq 1$. Thereafter the frequency multiplied reference signal has a frequency differing from the frequency of the signal from the SAW stabilized oscillator by an odd-order amount. A mixer is coupled to the frequency multiplying means and the second output signal path from the power dividing means. In response the mixer provides an output signal at an output terminal thereof corresponding to variations between a phase characteristic of the fundamental frequency $\omega_0$ from the SAW oscillator and a phase characteristic of the odd order harmonic of the reference frequency signal. With such an arrangement, a SAW stabilized voltage controllable oscillator is phase locked to a reference signal having a frequency which differs from the fundamental frequency of the SAW oscillator by an odd order factor. In particular, this arrangement permits a SAW stabilized oscillator to be phase locked to a reference signal which has phase characteristics which are more stable than those of the SAW oscillator but which has a frequency ratio including an odd order factor. For example, it is well known that bulk wave oscillators provide signals having lower phase noise per unit bandwidth characteristics at offset frequencies close to the carrier frequency when compared to noise levels provided from SAW stabilized oscillators. It is also known that bulk-wave oscillators provide signals having relatively higher phase noise per unit bandwidth characteristics at offset frequencies further removed from the fundamental frequency of the bulk wave oscillator when compared to corresponding characteristics of SAW stabilized oscillators. By providing a reference signal from such a bulk wave oscillator, the SAW stabilized voltage controllable oscillator will be phase locked to such signal and thus provide phase noise characteristics comparable to the phase noise characteristics of the bulk wave oscillator at close to carrier offset frequencies.

In accordance with a further aspect of the present invention, the phase locked oscillator further includes means fed by the phase detector output signal for providing a phase locking signal to the control terminal of the voltage controllable phase shifter having a bandwidth selected in accordance with the phase noise characteristics of the reference signal and SAW stabilized oscillator signal. With this arrangement, the bandwidth of the phase locking loop can be selected to permit the oscillator to be locked to the better noise phase characteristics of the SAW stabilized oscillator at offset frequencies further removed from that of the fundamental or carrier frequency of the SAW stabilized oscillator. Thus, the phase locked oscillator will have phase noise characteristics for frequencies further removed from the fundamental frequency of the SAW stabilized voltage controllable oscillator corresponding to the phase noise characteristics of the SAW oscillator.

In accordance with a further aspect of the present invention, the phase locked oscillator further includes means coupled to said mixer for providing a selectable DC voltage level above a reference potential at the output of said mixer to provide the error signal disposed about a DC voltage level. With this particular arrangement, by having the error signal disposed about a selectable DC voltage level, an error signal can be fed to amplifier circuits fed by a single supply voltage. This permits the error signal to have positive and negative deviations without the need for providing an additional power supply to the amplifier circuit used in the phase locked oscillator circuit.

BRIEF DESCRIPTION OF THE DRAWINGS

The foregoing features of this invention, as well as the invention itself, may be more fully understood from the following detailed description of the drawings, in which:

FIGS. 1A through 1C are schematic representations of an embodiment of an oscillator having phase locking circuitry in accordance with the present invention;

DESCRIPTION OF THE PREFERRED EMBODIMENTS

Figure 1A:
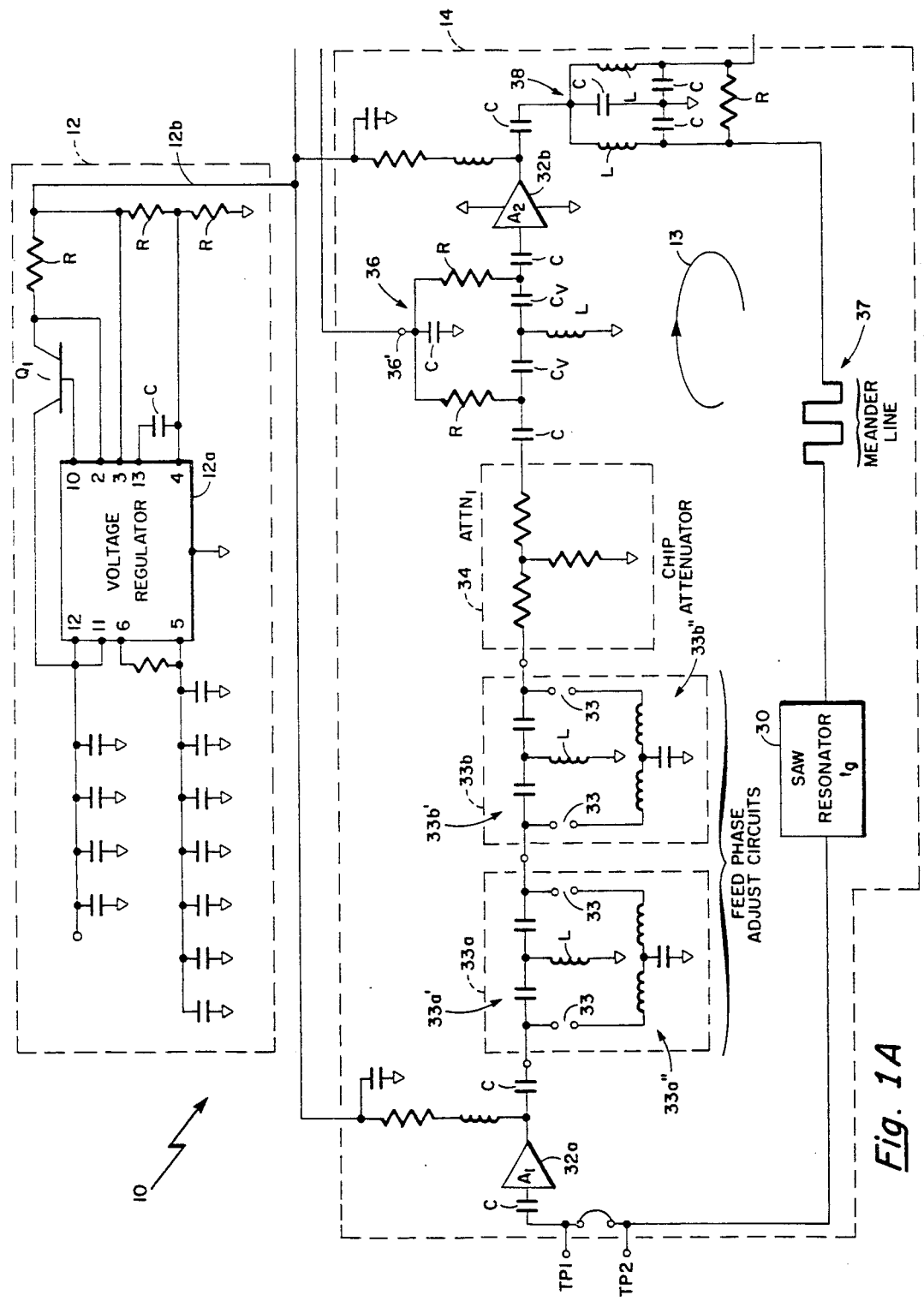

Referring now to FIGS. 1, 1A through 1C, a phase locked oscillator 10 is shown to include a DC bias voltage regulator circuit 12. The DC bias voltage regulator circuit 12 includes a conventional voltage regulator integrated circuit, as well as, necessary external components such as filtering capacitors, resistors (not referenced) and a transistor $Q_1$ used to set the output voltage as is generally known. This DC bias voltage regulator circuit 12 feeds the bias voltages to each circuit to be described which requires a DC bias. The phase locked oscillator 10 further includes a voltage controllable oscillator 14 here a SAW stabilized oscillator having a frequency stabilizing and determining element here a SAW resonator 30 disposed within a feedback loop generally denoted as 13. Alternatively the SAW device could also be a SAW delay line. Further, at higher frequencies a dielectric resonator could alternatively be used.

In addition to the SAW resonator 30, the feedback loop 13 further includes a pair of amplifiers here 32a, 32b, as shown, disposed with the loop 13 having DC blocking capacitors C disposed at input and outputs of the amplifiers 32a, 32b to prevent disruptions in bias levels to the amplifiers 32a, 32b. In general, each circuit to be described which has a bias voltage fed thereto would use DC blocking capacitors C at inputs and outputs. The feedback loop 13 further includes a pair of stages of fixed phase adjustments circuits 33a, 33b. Here said fixed phase adjust circuits include a plurality of terminals 33 which are selectively interconnected via bond wires (not shown) to provide one or both of circuits 33a, 33b disposed within the feedback loop 13. Furthermore, it is to be noted that each one of said circuits 33a, 33b has the provisions for optionally providing a phase advance circuit 33a', 33b' or a phase delay circuit 33a'', 33b'' with here phase advance circuits being a T network of a pair of series capacitors and a shunt inductor and phase delay circuits being T networks provided by a pair of series inductors and a shunt capacitor. Selection of a particular network for circuits 33a, 33b is predicated on the desired phase characteristics to be imparted to the oscillator 14 and thus is selected in accordance with the desired output frequency to be provided from the oscillator 14. The feedback circuit 13 further includes a voltage controllable phase shifter 36, here including a pair of voltage controllable capacitors such as varactor diodes $C_V$ here of the FLTVARS type from Frequency Sources, Inc. Chelmsford, Mass. coupled in series with a shunt coupled inductor L, as shown. The voltage controllable phase shifter 36 has a phase shift characteristic which is responsive to a control voltage fed to terminal 36'. The control signal fed to terminal 36' is used to bias the varactor diodes $C_1$ equally and hence impart a desired phase shift characteristic to the phase shifter 36 and concomitant therewith a selectable adjustment in the phase characteristics of the loop 13. Adjusting the phase characteristics of the loop 13 will provide a concomitant adjustment in the frequency $\omega_0$ of the oscillator 14.

The feedback loop 13 is shown to further include a meandered line 37 which is here a section of transmission line used to provide a coarse adjustment in the phase characteristics of the loop 13 and a power divider 38, as generally shown. Here power divider 38 is a 3 dB power divider which provides a pair of output signal paths with one of said signal paths disposed to complete the loop 13 and the other signal path disposed to feed a network 16, as will be described. Here, the power delivered to each one of the signal paths is equal. Other power division ratios may alternatively be used. Loop 13 further has an optional attenuator 34 which is used to adjust the small signal gain characteristics of the loop 13.

The second path of power divider 38 is fed to a preconditioning network 16 which includes an optional attenuator 40 and an optional buffer amplifier 43 which provides a buffered signal at the frequency $\omega_0$ to a power divider 42. Here power divider 42 is also a 3 dB power divider and provides a pair of signal paths 42a, 42b. Signal path 42a is coupled to here a first attenuator 44, a small signal, low noise amplifier 46, a lumped element low pass filter 47, and a second attenuator 48 (FIG. 1C). Attenuators 44 and 46 are optional and are used to adjust the output signal levels from oscillator 10, and amplifier 46 is used to provide additional amplification of the output signal from the oscillator 10 to isolate the SAW stabilized voltage controllable oscillator 14 from variations in load impedances at terminal 10b. The low pass filter 47 is used to increase the signal purity of the signal provided at the output terminal 10b of oscillator 10.

In general, the frequency of the signal at terminal 10b is an RF frequency generally in the range of 100 MHz to 2,000 MHz or the ranges of frequency common for SAW devices, such as SAW resonators and SAW delay lines, or other relatively high frequency resonance type devices such as dielectric resonator oscillators (DRO) (not shown) which could have practical resonance frequencies often higher than the range mentioned above. Generally for frequencies below about 100 MHz, bulk-wave devices are used.

Figure 2:
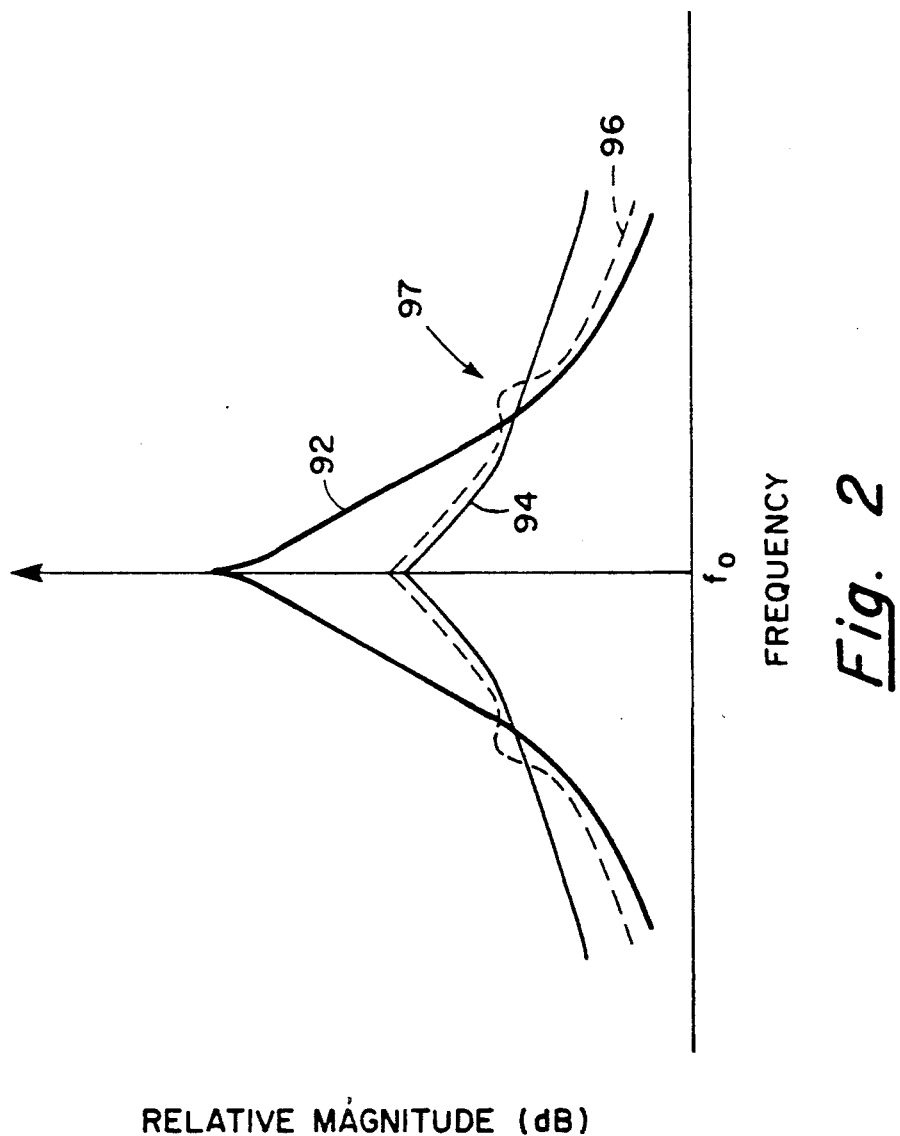
FIG. 2 is a plot of magnitude vs. frequency depicting typical phase noise characteristics of signals from SAW stabilized oscillators and signals from bulk-wave stabilized oscillators.

The second signal path 42b of power divider 42 is fed to phase detection circuitry 20 which includes a optional attenuator 50, a high-pass filter 52, an amplifier 53, as well as, a first mixer 54 (FIG. 1C) of the type as will be generally described in conjunction with FIG. 2. Here the signal provided at the output path 42b of power divider 42 is coupled through the attenuator 50 to provide an adjustable amplitude for said signal. The high pass filter 52 is disposed to filter out undesired low frequency components which may leak from the mixer stages 54 and appear at the output 10b of the phase locked oscillator 10. The amplifier 53 is provided to buffer the signal and provide a selectable amount of signal gain. The signal having a frequency $\omega_0$ is coupled from the amplifier 53 through DC blocking capacitor C to a first input terminal 54a of mixer 54. Here terminal 54a corresponds to a local oscillator frequency input terminal (1) of the mixer as will be further described in conjunction with FIG. 2.

A second input terminal 54b corresponding to here the RF input signal terminal (R) 54b of the mixer 54 is fed by here a frequency multiplied reference signal. The frequency multiplied reference signal here has a frequency which is twice that of a reference signal fed to a reference signal input terminal 10a of the phase locked oscillator 10.

The reference signal at terminal 10a is shown provided through a first stage of buffer amplification via an amplifier 61 and fed to an input of a 3 dB power divider 62 having a pair of output signal paths with a first one of said signal paths being fed directly to an input 64a corresponding to a local oscillator input of a second mixer 64 and the second one of said signal paths being fed through a phase shifter which provides a 90° phase shift to the reference signal. The reference frequency signal is fed to a second input terminal 64b of mixer 64 which here corresponds to the RF input signal terminal (R). The reference signal from terminal 10a is fed in quadrature to mixer 64 to maximize production of even order especially here the second order harmonic of the reference frequency signal. The output signal terminal 64c, here the intermediate frequency signal terminal is fed through a bandpass filter 68, here a lumped element filter, onto to an optional stage of amplification 69. At the output of amplifier 69 is thus provided the frequency multiplied reference signal, mentioned above, here having a frequency which is twice the frequency of the reference input signal originally fed to terminal 10a.

The SAW stabilized voltage controllable oscillator signal $\omega_0$, as well as, the reference input signal, having a frequency relative to the oscillator frequency $\omega_O$ given by $\omega_0/(2n+1)$ where n is an integer $>1$, are fed to mixer 54. The mixer 54 provides various signal components at the output 54c here corresponding to the intermediate frequency terminal (I) of the mixer 54. Included in the various frequency components, $(2N+1)\omega_0/(2n+1)$, provided at the output signal terminal 54c is a frequency component corresponding to $(2n+1)\omega_0/(2n+1) - \omega_o$ where $N=n$. The mixer 54 produces the odd order harmonic $(2n+1)\omega_0/(2n+1)$ and also provides the signal $(2n+1)\omega_0/(2n+1) - \omega_0$ which is the phase locking signal. The phase locking signal at terminal 54c is fed to low pass filter 70 (FIG. 1B) of the error signal conditioning circuit 22. The frequency response of filter 70 is selected to pass the baseband frequency or phase locking signal and suppress the oscillator fundamental, as well as, undesired harmonics thereof. The output of low pass filter 70 is fed to a pair of high gain stages of amplification 72, 74.

Stage 72 is an inverting operational amplifier gain stage having a gain characteristic selected by the ratio of resistor $R_2$ and resistor $R_1$ as is known. The gain stage 72 provides a larger phase detector constant. Stage 74 is also an inverting gain stage having resistors $R_4$ and $R_5$ and a capacitor C which provide in combination addition gain and which also set the capture range or phase lock loop bandwidth of the phase locking circuit. Generally, the phase lock loop bandwidth is set at a frequency where the phase noise characteristics of the reference signal become higher than the phase noise characteristics of the SAW stabilized oscillator. This permits the phase locked oscillator to have overall phase noise characteristics which are comparable to the best portion of the phase noise characteristics of both the reference signal and the SAW oscillator.

The stages 72, 74 are also provided with adjustable networks comprised of resistors as shown, to permit adjustment of the characteristics of said amplifiers to minimize DC offset voltages and thus minimize errors at terminal 36' introduced into the signal provided at the output of low pass filter 70 as would be known to a person of ordinary skill in the art. At the output of error signal conditioning circuit 22 a signal along a line (not referenced) is fed to terminal 36' of voltage controllable phase shifter 36. In accordance with the signal level provided thereto, the phase characteristic of phase shifter 36 is selectively varied to provide an overall selective adjustment in the phase characteristic of oscillator 14 thus locking oscillator 14 to the phase characteristics of the signal fed through reference input terminal 10a over the bandwidth of the phase detector circuit 22.

As shown in FIG. 2, the SAW stabilized, voltage controllable oscillator which is used for its relatively low phase noise characteristics at offset frequencies far from the carrier frequency (curve portion 92) is locked to a reference signal such as that provided from a bulk wave oscillator which can have lower levels of phase noise at offset frequencies close to the carrier (curve portion 94). Therefore, the short term frequency stability of the oscillator 10 (curve 96) is better than that corresponding to a free-running SAW oscillator for offset frequencies close to carrier and is also better than that of the reference signal at offset frequencies further removed from carrier. At the point 97 where phase locking transitions from the bulk wave signal to the SAW oscillator signal there is a slight increase in phase noise, as shown.

Furthermore, if the bulk crystal oscillator reference signal provides a clock signal for digital circuitry in the particular system, then the SAW stabilized oscillator 10 is also phase locked to the digital clock signal which provides overall system phase coherency. A further advantage is that the SAW stabilized voltage controllable oscillator having the phase locking circuitry provides a technique for locking to a lower frequency signal having a frequency which differs by an integer having an odd prime factor relation to the frequency of the SAW oscillator without degrading phase noise characteristics or introducing spurious frequencies or frequency instability.

As a further illustrative example, consider that the SAW stabilized voltage controllable oscillator has a nominal fundamental frequency given by $\omega_0$ ($\omega_0 = 2\pi f_0$) whereas the lower frequency reference input signal has a nominal frequency given by $\omega_0/6$. In the arrangement described above, the reference signal fed to terminal 10a is coupled through the first frequency doubler here provided by mixer 64 to translate the incoming reference signal having the frequency $\omega_0/6$ to a signal having a frequency $\omega_0/3$ while maintaining relatively low phase noise characteristics of the reference signal. The frequency multiplied reference signal having a frequency $\omega_0/3$ is then fed to the second mixer 54 which here acts as a sub-harmonic phase detector between the signal at $\omega_0$ and the signal at $\omega_0/3$ to generate a low frequency signal or error signal corresponding to the differences in phase between the two signals. This signal which is fed at output 54c and through error conditioning circuit 22 provides the error or locking signal to the oscillator 14.

Figure 1B:
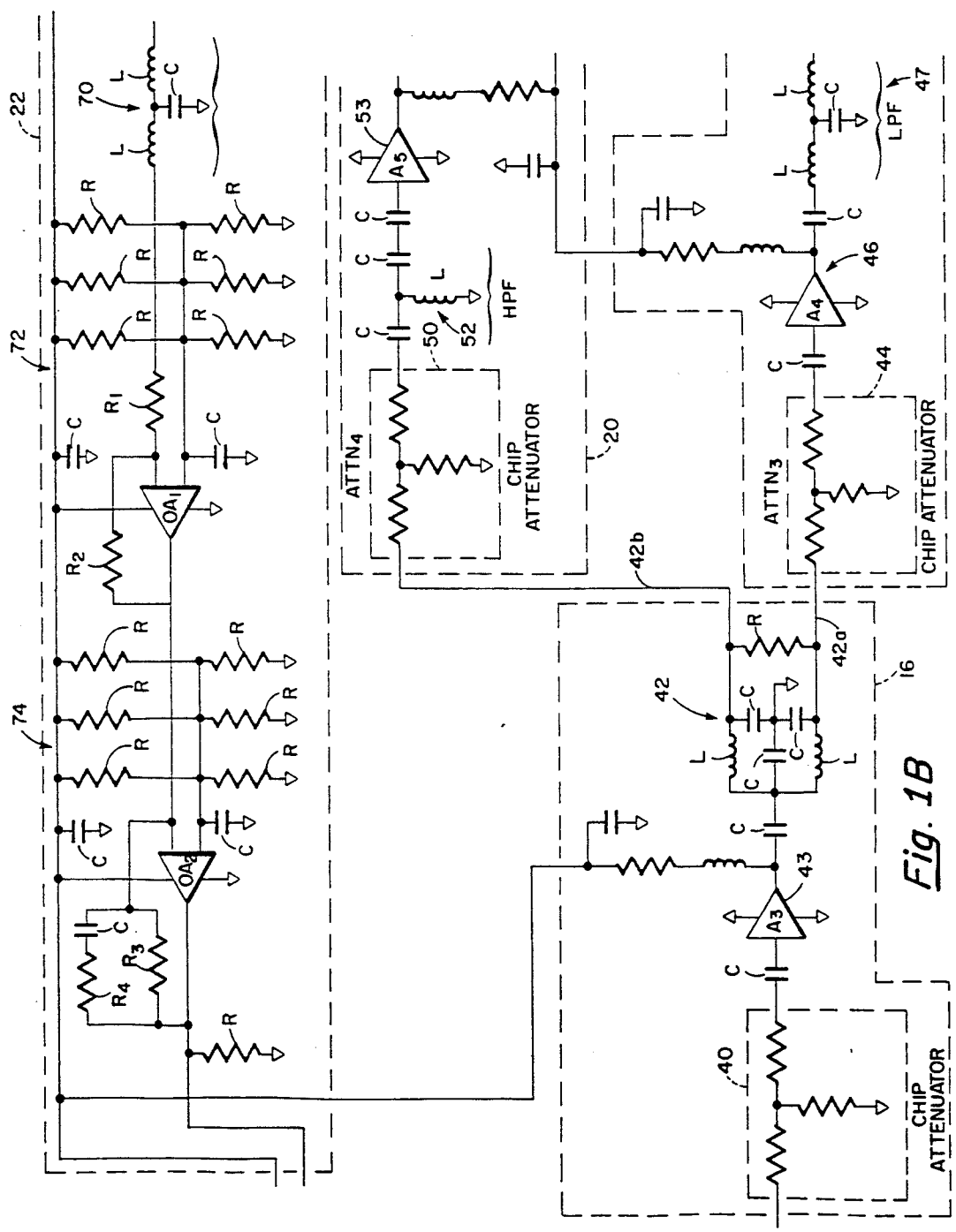
Figure 1:
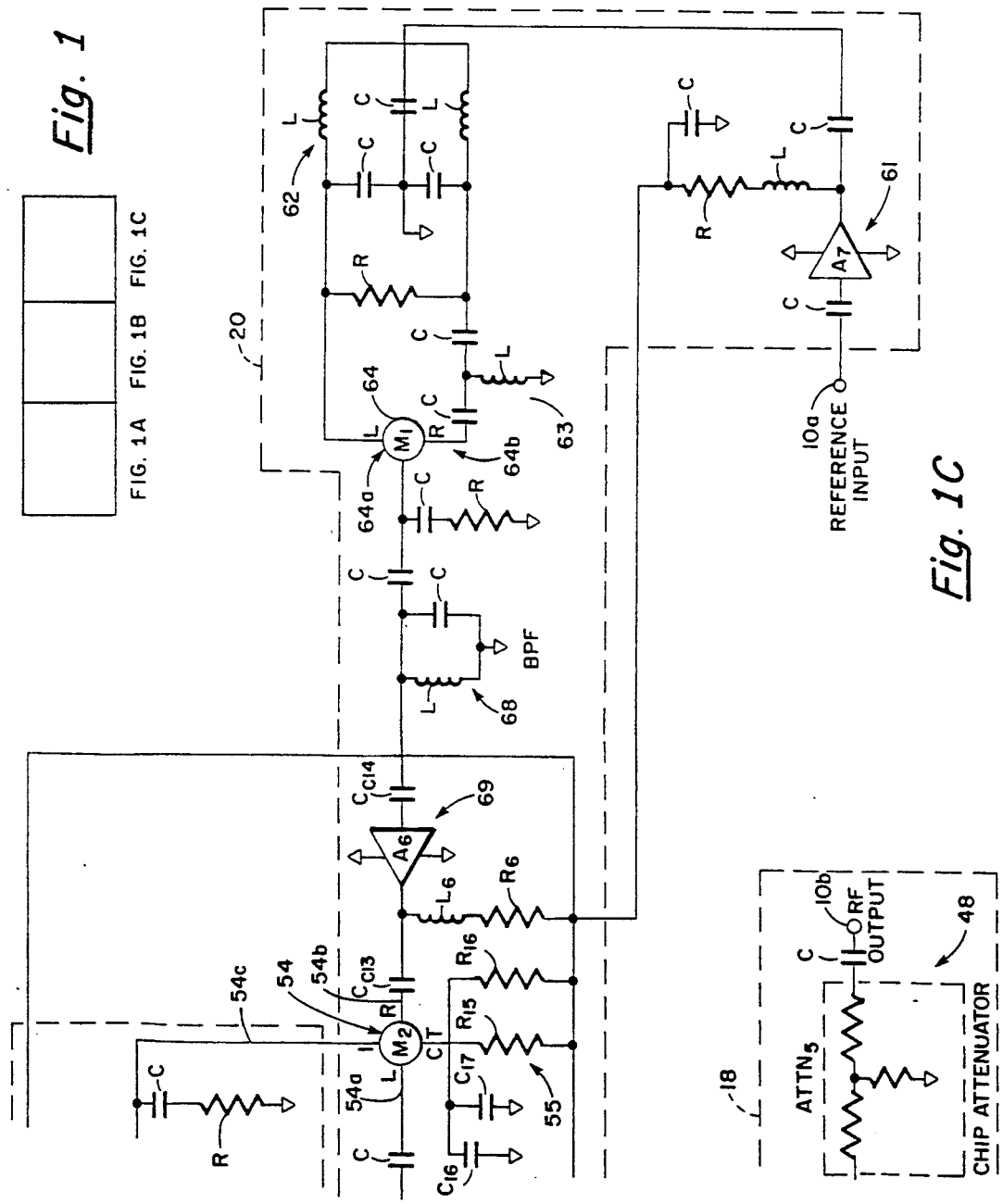
FIG. 1 shows the relationship between FIGS. 1A through 1C.

Here for optimum performance, lumped element reactive power splitters, as shown in FIG. 1, are used for signal dividing particularly where high isolation is desired. This arrangement permits the SAW oscillator circuit to be substantially immune to external load variations, as well as, reference source impedance variations. Furthermore, as shown in FIG. 1, the circuit 10 preferably includes an internal voltage regulator 12a which is part of network 12 to provide a well-regulated DC bias voltage to all of the active devices in the circuit. As would also be appreciated, DC bias levels on line 12b are fed to all circuits which require such a DC bias voltage. Furthermore, inductors (chokes), filtering capacitors, and stabilizing resistors are disposed adjacent said circuits to provide suitable filtering and isolation of the DC bias voltage.

Although the above described phase locked oscillator has been particularly described in conjunction with a ratio of six between the fundamental frequency of the oscillator $\omega_0$ and the reference input frequency $\omega_0/6$, it is to be understood that any ratio having an odd-order factor can be accommodated by the principles of the above approach. For example, a fundamental frequency of $\omega_0$ could be phase locked to a reference signal frequency of $\omega_0/10$ by feeding the signal having the frequency $\omega_0/10$ to mixer stage 64 to provide a frequency multiplied reference signal having a frequency $\omega_0/5$. The signal having the frequency $\omega_0/5$ is then fed to phase detector 54. Phase detector 54 would sub-harmonically mix the fundamental frequency signal $\omega_0$ and the reference signal $\omega_0/5$ by using the fifth harmonic of $(\omega_0/5)$ to provide the error signal at terminal 54c. The frequency response of the filter at the output of the phase detector 54 would thus pass the baseband frequency $\omega_0 - (2n+1)\omega_0/(2n+1)$ while suppressing the oscillator fundamentals $\omega_0$, $\omega_0/(2n+1)$ and other harmonics thereof.

Further, cascaded stages (not shown) of mixer 64 could also be used to provide the frequency multiplied reference signal having a frequency of $2^N(\omega_0/r)$ where r is the initial ratio of the SAW oscillator frequency to reference signal frequency $\omega_0/r$, and r has prime factors of $2^N$ and y, where y is an odd number and N is an integer 0, 1, 2 . . .

Figure 3:
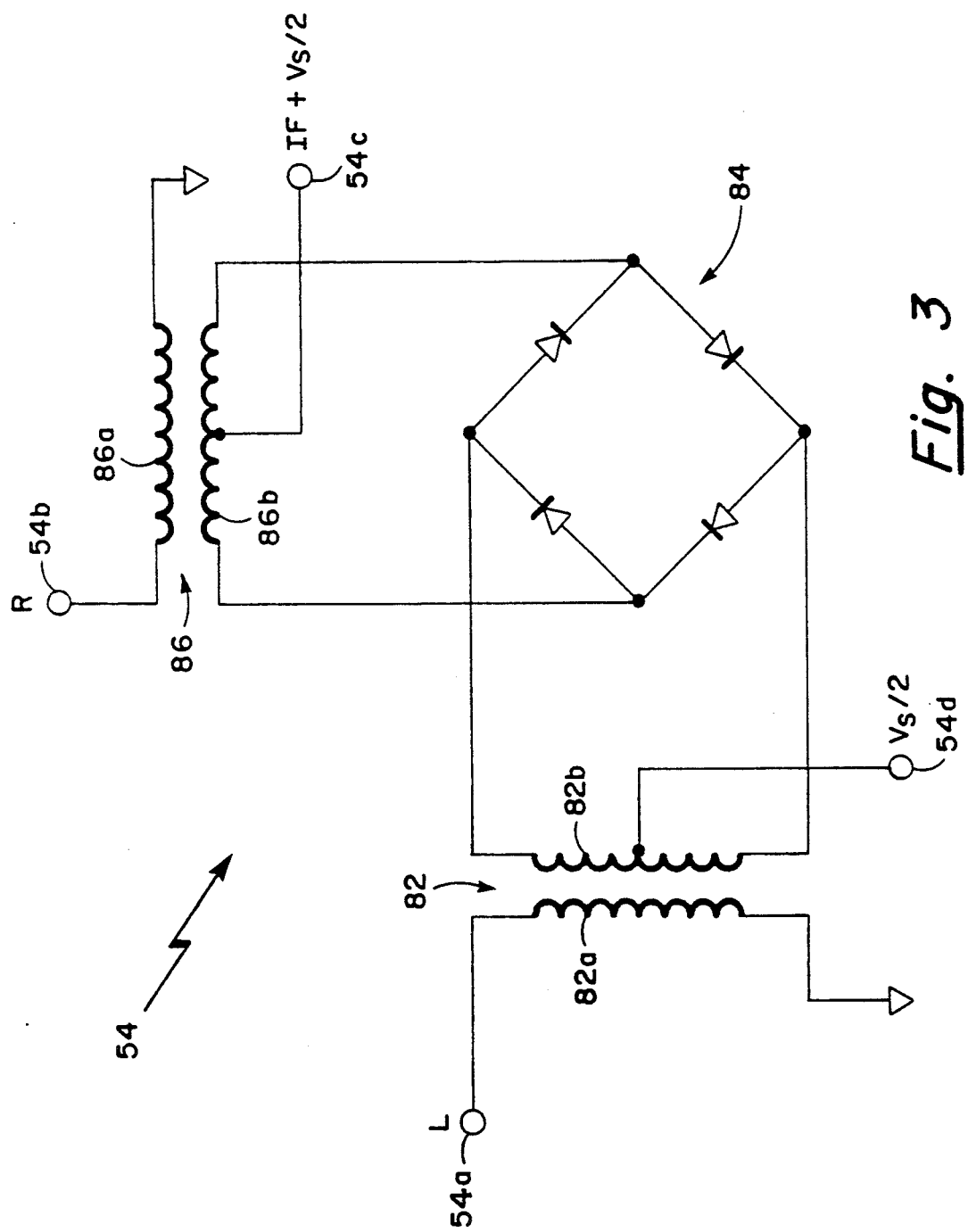
FIG. 3 is a schematic representation of a mixer arrangement suitable for use in the oscillator described in conjunction with FIG. 1.

Referring now to FIG. 3, a schematic representation of the mixers used for the phase detector 54 and the frequency doubler 64 is shown. Here the mixers are doubly balanced diode bridge type mixers. A preferred type is an RMS-2 type obtained from Mini-Circuits, Inc., Brooklyn, N.Y. although other mixer circuits may alternatively be used. When the above oscillator 10 is fabricated as a hybrid integrated circuit as in conventional oscillator circuits, the advantage of using the above type of mixer is that access is easily provided to the center taps of each one of the transformer windings. Here mixer 54 has a first center tap transformer 82 having a primary winding coupled between terminal 54a (the local oscillator terminal) and ground and a center tapped secondary winding 82b with the center tap coupled to terminal 54d, and the branches of the secondary coupled to a pair of nodes of a diode bridge 84, as shown. The mixer 54 further includes a second center tap transformer 86 with a center tap secondary 86b having branch arms coupled to a second set of nodes of the diode bridge 84, as shown, and having the center tap of a secondary 86b coupled to terminal 54c which generally corresponds to the IF terminal for the mixer 54. A primary winding 86a of transformer 86 is coupled between terminal 54b (the RF terminal) and ground, as shown. By having access to the center tap on each one of the transformers in the mixer 54 particularly at terminal 54d, a bias voltage level may be fed to terminal 54d to provide at the output 54c the intermediate frequency signal (at baseband frequencies) corresponding to the difference in phase between the signals fed to terminal 54a and to terminal 54b, disposed about a DC level corresponding to the DC voltage provided to terminal 54d.

Referring now back to FIGS. 1A–1C, the detection circuitry 20 is shown to further include a network 55, here a resistor voltage divider network which is fed via the bias voltage line 12b to provide a bias voltage corresponding to one half the supply voltage $V_S/2$ at terminal 54d of mixer 54.

At output 54c of mixer 54 the signal is fed to a low-pass filter 70 disposed in error signal conditioning circuit 22. The magnitude of error signal $\omega_{IF}$ is disposed about a DC voltage level corresponding to $V_S/2$. This permits operational amplifier stages 72 and 74 of circuit 22 to operate using a single polarity supply voltage here $+V_S$ thereby eliminating the need for here a negative supply voltage. It is to be noted that at the output 54c of mixer 54 that the error signal without a DC voltage level would have positive and negative amplitudes. To accommodate the negative amplitude of such a signal the amplifier stages 72, 74 would otherwise require the presence of a negative power supply. By providing network 55 coupled to the mixer 54 in the manner as shown, this need is avoided.

Amplifier stages 72, 74 also have selectable resistor dividers (not referenced) which can be used to selectively compensate for variations in offset voltages from stages 72, 74.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. An oscillator comprising:
    a voltage controllable oscillator having an output terminal and a control voltage terminal fed by an error signal;
    means coupled to said output terminal of said voltage controllable oscillator for providing a first pair of signal paths; and
    means, including a mixer coupled to a first one of said first pair of signal paths and fed by a reference signal having a frequency related by an odd-order harmonic to the nominal frequency of said voltage controllable oscillator, for providing the error signal representing the variation in phase between the odd-order harmonic of said reference signal and said voltage controllable signal.

2. The oscillator of claim 1, wherein said voltage controllable oscillator includes a frequency stabilizing and determining element.

3. The oscillator, as recited in claim 1, wherein the means for providing an error signal further includes a low pass filter having a passband selected to suppress frequencies corresponding to the fundamental frequency of the voltage controllable oscillator and other harmonics thereof.

4. The oscillator, as recited in claim 3, wherein the means for providing the error signal further comprises:
    amplification means coupled to said low pass filter for providing an amplified error signal from the output of the error providing means.

5. The circuit, as recited in claim 4, wherein said amplification means further comprises:
    means for selecting the bandwidth of the means for providing the error signal.

6. The oscillator of claim 1, wherein said mixer comprises:
    first and second center tap transformers; and
    a diode bridge comprised of four diodes each having cathodes and anodes, with the cathode of one diode being coupled to the anode of a succeeding diode and with the anode of a last one of said diodes being coupled to the cathode of a first one of said diodes with each one of said center tap transformers having center tap secondary windings with branches of the secondary windings coupled across a corresponding pair of nodes of the diode bridge, and with a center tap terminal of one of said secondary windings being fed a DC bias level to provide at a second center tap terminal of a second secondary winding an output terminal of the mixer disposed at the DC bias level.

7. A phase locked oscillator comprising:
    a SAW stabilized voltage controllable oscillator having an output terminal comprising:
        means for providing a closed loop having an integral multiple of $2\pi$ radians of phase shift and excess small signal gain at a frequency $\omega_0$, said means further comprising:
            a SAW resonator having a resonant frequency at $\omega_0$;
            a voltage controllable phase shifter having a pair of terminals disposed within said closed loop means path and a control terminal;
    means, coupled to the output of said voltage controllable oscillator, for providing first and second signal paths, the first signal path coupled to an output of said phase locked oscillator;
    means, coupled to a reference signal input, for providing a reference signal with a frequency related to an odd-order harmonic of the nominal frequency of the SAW stabilized voltage controllable oscillator; and
    mixer means, having a first input coupled to the frequency increasing means and a second input coupled to the second signal path from the providing means for providing at an output of said mixer means a signal having a frequency related to the difference in frequency between the frequency of said SAW stabilized voltage controllable oscillator and the reference signal;
    a filter coupled to the output of the mixer means having a passband characteristic which passes the signal having the difference frequency; and
    means for amplifying said signals having the difference frequency and for feeding said amplified signal to the control terminal of the voltage controllable oscillator.

8. The phase locked oscillator of claim 7 further comprising:
    means coupled between said amplifying means and said control terminal of the voltage controllable oscillator for adjusting a DC offset voltage characteristic of said signal fed to the control terminal and for adjusting a bandwidth characteristic of said amplifying means.

9. The phase locked oscillator of claim 7, wherein said mixer means comprises:
    first and second center tap transformers;

a diode bridge comprised of four diodes each having cathodes and anodes with the cathode of one diode being coupled to the anode of a succeeding diode and with the anode of a last one of said diodes being coupled to the cathode of a first one of said diodes, with each one of said center tap transformers having second centered tap secondary windings with branches of the secondary windings coupled across a corresponding pair of nodes of the diode bridge and with the center tap terminal of one of said secondary windings being fed a DC bias level to provide at a second center tap terminal of a second secondary winding an output of the mixer means disposed at the DC bias level.

10. The oscillator, as recited in claim 9, wherein said DC bias level is set at a voltage corresponding to approximately one half of a DC supply voltage fed to said amplifying means.

11. A phase locked oscillator comprising:

a SAW stabilized voltage controllable oscillator having an output terminal comprising:

means for providing a closed loop having an integral multiple of $2\pi$ radians of phase shift and excess small signals gain at a frequency $\omega_0$;

said means comprising:

a SAW resonator having a resonant frequency at $\omega_0$;

a phase shifter which provides a fixed phase shift to a signal in said closed loop; and a voltage controllable phase shifter having a pair of terminals disposed within said closed loop means and a control terminal, said voltage controllable phase shifter comprising:

at least one reactive element which has a reactance characteristic which varies in accordance with a bias voltage fed to the reactance element to provide a voltage controllable phase shift;

means coupled to the output of said voltage controllable oscillator for providing first and second signal paths, with the first path coupled to an output of said phase locked oscillator;

means coupled to a reference signal for multiplying the frequency of the reference signal by an even order;

means fed by the frequency multiplied reference signal and a signal from said SAW stabilized voltage controllable oscillator for providing a signal having a frequency related to the difference in frequency between said signal from the SAW stabilized voltage controllable oscillator and a odd-order harmonic of said multiplied reference signal.

12. The phase locked oscillator, recited in claim 11, further comprising:

a filter coupled to the output of the mixer means having a passband characteristic which passes the signal from the mixer and rejects signals out of said passband and means for amplifying said filtered signal and for providing said amplified filter signal to the control terminal of the voltage controllable oscillator.

13. The oscillator, recited in claim 12, wherein said mixer comprises:

first and second center tap transformers;

a diode bridge comprised of four diodes each having cathodes and anodes with the cathode of one diode being coupled to the anode of a succeeding diode and with the anode of a last one of said diodes being coupled to the cathode of a first one of said diodes with each one of said centered tap transformers having center tap secondary windings with branches of the secondary windings coupled across a corresponding pair of nodes of the diode bridge and with a center tap terminal one of said secondary windings being fed a DC bias level to provide at a second secondary winding an output terminal of the mixer disposed at the DC bias level.

14. The phase locked oscillator, recited in claim 13, wherein said output terminal of the mixer is disposed at a DC bias level corresponding to approximately one half of the supply voltage fed to the amplification means.

* * * * *